United States Patent
Okamoto

(10) Patent No.: US 8,860,013 B2
(45) Date of Patent: Oct. 14, 2014

(54) ORGANIC ELECTROLUMINESCENCE ELEMENT, MANUFACTURING METHOD THEREOF, AND ORGANIC ELECTROLUMINESCENCE DISPLAY DEVICE

(75) Inventor: Ken Okamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 167 days.

(21) Appl. No.: 13/511,636

(22) PCT Filed: Oct. 12, 2010

(86) PCT No.: PCT/JP2010/067883
§ 371 (c)(1),
(2), (4) Date: May 23, 2012

(87) PCT Pub. No.: WO2011/065137
PCT Pub. Date: Jun. 3, 2011

(65) Prior Publication Data
US 2012/0261653 A1  Oct. 18, 2012

(30) Foreign Application Priority Data
Nov. 27, 2009 (JP) ................................ 2009-270822

(51) Int. Cl.
*H01L 51/00* (2006.01)
*H01L 51/50* (2006.01)
*H05B 33/10* (2006.01)

(52) U.S. Cl.
CPC ........ *H01L 51/5016* (2013.01); *H01L 51/5004* (2013.01); *H05B 33/10* (2013.01); *H01L 2251/5384* (2013.01)
USPC  257/40; 257/98; 257/E51.018; 257/E51.026; 313/504; 438/82; 438/99

(58) Field of Classification Search
CPC ............ H01L 51/5012; H01L 51/5048; H01L 27/3209; H01L 2251/552
USPC ...................... 257/40, 98, E51.018, E51.026; 313/504; 438/82, 99
See application file for complete search history.

(56) References Cited

U.S. PATENT DOCUMENTS 8,384,070 B2 *  2/2013  Kishino ........................... 257/40
8,610,109 B2 * 12/2013  Yamazaki et al. ............... 257/40

(Continued)

FOREIGN PATENT DOCUMENTS

JP  2005-108572 A  4/2005
JP  2005-203293 A  7/2005

(Continued)

OTHER PUBLICATIONS

Lee et al., "Suppression of Efficiency Roll off in Blue Phosphorescent Organic Light-Emitting Devices using Double Emission Layers with Additional Carrier-Tranporting Material", Applied Physics Letters, vol. 94, 2009, pp. 083506-1-083506-3.

(Continued)

Primary Examiner — Eduardo A Rodela
(74) Attorney, Agent, or Firm — Morrison & Foerster LLP

(57) ABSTRACT

An organic EL element (11) includes a light emitting layer (15) which has a two-layer structure, and a first light-emitting layer (15a) is made from a host material which includes LUMO shallower than (i) LUMO (19) of a phosphorescent light emitting material and (ii) LUMO of a host material, from which a second light-emitting layer (15b) is made. Further, the second light-emitting layer (15b) is made from a host material which includes HOMO deeper than (i) HOMO (18) of the phosphorescent light emitting material and (ii) HOMO of the host material, from which the first light-emitting layer (15a) is made. This makes it possible (i) to block holes from moving to the second light-emitting layer (15b) and (ii) to block electrons from moving to the first light-emitting layer (15a). As a result, a probability that the holes and the respective electrons recombine with each other is increased. It is therefore possible to reduce a driving voltage of an organic EL element (11). This improves light emitting efficiency.

11 Claims, 5 Drawing Sheets

(56) References Cited

U.S. PATENT DOCUMENTS

| | | | |
|---|---|---|---|
| 2007/0052346 A1* | 3/2007 | Iwakuma et al. | 313/504 |
| 2009/0091244 A1* | 4/2009 | Negishi et al. | 313/504 |

FOREIGN PATENT DOCUMENTS

| | | |
|---|---|---|
| JP | 2006-100806 A | 4/2006 |
| JP | 2007-251097 A | 9/2007 |
| JP | 2008-277494 A | 11/2008 |
| JP | 2009-147276 A | 7/2009 |
| WO | 2006/070619 A1 | 7/2006 |
| WO | 2011/065136 A1 | 6/2011 |
| WO | 2011/065138 A1 | 6/2011 |

OTHER PUBLICATIONS

Watanabe et al., "Chemistry of Electron Transfer—Introduction to Electrochemical", The Chemical Society of Japan 1st Edition, Apr. 25, 1996, 17 Pages. (9 pages of Partial English translation and 8 pages of Original).

International Search Report received for PCT Patent Application No. PCT/JP2010/067883 mailed on Jan. 25, 2011, 5 pages. (2 pages of English translation and 3 pages of PCT Search Report).

Lee et al., "Suppression of Efficiency Roll off in Blue Phosphorescent Organic Light-Emitting Devices using Double Emission Layers with Additional Carrier-Transporting Material", Applied Physics Letters, vol. 94, 2009, pp. 083506-1-083506-3.

Tokito et al., "Organic Electroluminescense Display", Ohmsha Ltd., First Edition, 186 Pages. (3 pages of Partial English translationg and 183 pages of Original Document).

* cited by examiner

ORGANIC ELECTROLUMINESCENCE ELEMENT, MANUFACTURING METHOD THEREOF, AND ORGANIC ELECTROLUMINESCENCE DISPLAY DEVICE

CROSS REFERENCE TO RELATED APPLICATIONS

This is a U.S. National Phase patent application of PCT/JP2010/067883, filed Oct. 12, 2010, which claims priority to Japanese Patent Application No. 2009-270822, filed Nov. 27, 2009, each of which is hereby incorporated by reference in the present disclosure in its entirety.

TECHNICAL FIELD

The present invention relates to (i) an organic electroluminescence element for attaining high luminance, high efficiency, and a long operating life, (ii) a method for manufacturing the organic electroluminescence element, and (iii) a display employing the organic electroluminescence element.

BACKGROUND ART

In recent years, needs for a display device with a thin flat-panel display (FPD) is being increased, in place of a display device employing a cathode-ray tube which has conventionally and mainly been used. There are various types of FPDs such as a non-self-luminous liquid crystal display (LCD), a self-luminous plasma display panel (PDP), an inorganic electroluminescence (inorganic EL) display, and an organic electroluminescence (organic EL) display.

Among them, the organic EL display has been researched and developed diligently. This is because an element (organic EL element) for display (i) is thin and light in weight and (ii) has further characteristics such as low driving voltage, high luminance, and self-luminous.

The organic EL element includes: a pair of electrodes (anode and cathode) on a substrate; and an organic layer provided between the pair of electrodes. The organic layer includes at least a light emitting layer. The light emitting layer is formed by adding an organic light emitting material to a host material. Generally, the organic EL element further includes (i) a hole injection layer, in which an accepter is added to a host material, between the light emitting layer and the anode and (ii) an electron injection layer, in which a donor is added to a host material, between the light emitting layer and the cathode.

In response to a voltage applied across the anode and the cathode of the organic EL element, (i) holes are injected from the anode into the organic layer and (ii) electrons are injected from the cathode into the organic layer. A hole and an electron, injected from the respective electrodes, recombine with each other in the light emitting layer. This causes an exciton to be generated. The organic EL element emits light by use of light generated when the exciton deactivates.

The light emitting layer is generally made from an organic light emitting material such as a phosphorescent light emitting material or a fluorescent light emitting material. An organic EL element made from the phosphorescent light emitting material has the advantage of high light emitting efficiency and a long emission life. For this reason, recently, the organic EL element in which the light emitting layer is made from the phosphorescent light emitting material has been becoming popular. Further, in order to reduce power consumption of the organic EL elements, there has been developed an organic EL element which is made from a phosphorescent light emitting material having maximum internal quantum yield of 100%.

An organic EL element emitting red light and an organic EL element emitting green light each have employed a light emitting layer made from the phosphorescent light emitting material having a maximum internal quantum yield of maximum 100%. However, an organic EL element emitting blue light has not yet employed a light emitting layer made from the phosphorescent light emitting material having a maximum internal quantum yield of 100%. Instead, a phosphorescent light emitting material having a maximum internal quantum yield of 25% has been employed in the organic EL element emitting blue light.

The organic EL element needs higher energy to emit blue light, as compared with a case where the organic EL elements emit red light or green light. Furthermore, if the energy is obtained from an excited triplet ($T_1$), then it is necessary to confine, within the phosphorescent light emitting material for the light emitting layer, all of $T_1$, electrons, and holes. It is therefore necessary to extremely increase an energy gap between a highest occupied molecular orbital (HOMO) and a lowest occupied molecular orbital (LUMO) not only in a material from which the light emitting layer is made, but also in a material for the periphery of the light emitting layer. However, since the energy gap between the HOMO and the LUMO of the light emitting layer is increased, it is difficult to use, as a host material from which light emitting layer is made, a material in which (i) molecules are conjugated and interacted with each other and (ii) carrier mobility is high. Accordingly, light emitting efficiency of the organic EL element is low, even though it is necessary to apply a high voltage across the anode and the cathode so as to drive an organic EL element which employs a blue phosphorescent light emitting material. This is a problem.

A specific example of a conventional organic EL element 31 whose light emitting layer is made from a blue phosphorescent light emitting material is illustrated in FIG. 8. FIG. 8 is a view illustrating an energy diagram of layers constituting the conventional organic EL element 31 whose light emitting layer is made from the blue phosphorescent light emitting material. In FIG. 8, a hole injection layer 33, a hole transport layer 34, and an electron transport layer 36 employ, as their host materials, NPB (HOMO=5.5 eV, LUMO=2.4 eV), mCP (HOMO=5.9 eV, LUMO=2.4 eV), and 3TPYMB (HOMO=6.8 eV, LUMO=3.3 eV), respectively. A light emitting layer 35 employs FIr6 (HOMO=6.1 eV, LUMO=3.1 eV) as a phosphorescent light emitting material. In a case where holes and electrons are confined within the FIr6, the light emitting layer 35 employs, as a host material, UGH2 (HOMO=7.2 eV, LUMO=2.8 eV) whose energy gap between the HOMO and the LUMO is large. However, the energy gap of the UGH2 is too wide to efficiently propagate the holes from the hole transport layer 34 to the light emitting layer 35. Similarly, the UGH2 cannot efficiently propagate the electrons from an electron transport layer 36 to a light emitting layer 35. Accordingly, even though the organic EL element 31, which employs the blue phosphorescent light emitting material, needs a high driving voltage, its light emitting efficiency is low.

In view of the circumstances, the organic EL element, whose light emitting layer is made from the blue phosphorescent light emitting material, has been devised so as to improve its light emitting efficiency. For example, Non-patent Literature 1 discloses an organic EL element which includes two light emitting layers. Specifically, Non-patent Literature 1 discloses the organic EL element which includes, between a pair of electrodes, an organic layer in which a hole injection layer, a first light-emitting layer, a second light-emitting layer, and an electron injection layer are formed in this order. In Non-patent Literature 1, a hole injection layer and an electron injection layer employ, as their host materials, DTASi (HOMO=5.6 eV, LUMO=2.2 eV) and Bphen (HOMO=6.4 eV, LUMO=3.0 eV), respectively. Further, a first light-emitting layer and a second light-emitting layer employ, as their host materials, 4CzPBP (HOMO=6.0 eV, LUMO=2.5 eV) and PPT (HOMO=6.6 eV, LUMO=2.9 eV), respectively. FIrpic (HOMO=5.8 eV, LUMO=2.9 eV) is added, as a blue phosphorescent light emitting material, to the respective first and second light-emitting layers.

With the arrangement, it is possible to provide an organic EL element in which each of (i) an energy gap between the HOMO and the LUMO of the first light-emitting layer and (ii) an energy gap between the HOMO and the LUMO of the second light-emitting layer, is small. This makes it possible to employ a host material which causes an improvement in each mobility of hole and electron in the light emitting layer. This is because, in an organic deposited film, the hole and the electron are transported by hopping conduction (see Non-patent Literature 2). In order that an electron conducts between molecules by the hopping conduction, it is necessary for wave functions between two electron states, i.e., between a neutral state and a radical anion state to largely overlap each other. Meanwhile, in order that a hole conducts between molecules while hopping, it is necessary for wave functions between two electron states, i.e., between a neutral state and a radial cation state to largely overlap each other. That is, the mobility of the hole and the electron becomes larger as (i) stacking of the neutral state and a radical anion state or (ii) stacking of the neutral state and a radical cation state ($\pi$-$\pi$ interaction) becomes stronger. Further, when the stacking becomes strong, the energy gap between the HOMO and the LUMO becomes small. Accordingly, this arrangement can provide an organic EL element in which (i) a voltage for driving the organic EL element is low, i.e., 4.6V under the condition of 1000 cd/m$^2$ and (ii) a light emitting efficiency is high, i.e., 22 cd/A.

CITATION LIST

Non-patent Literature

Non-patent Literature 1
Applied Physics Letters 94, 083506, 2009
Non-patent Literature 2
Organic EL Display (Ohmsha, Ltd., published in August, 2004, by TOKITO Shizuo, ADACHI Chihaya, and MURATA Hideyuki)
Non-patent Literature 3
Introduction to Electrochemistry—Chemistry of Electron Transfer (Asakura Publishing Co., Ltd., published in September, 2005, by WATANABE Tadashi and NAKABAYASHI Seiichiro)

SUMMARY OF INVENTION

Technical Problem

According to the organic EL element of the Non-patent Literature 1, when electrons are propagated from an electron injection layer to a second light-emitting layer, the electrons are propagated to a light emitting dopant (FIrpic). However, the organic EL element disclosed in the Non-patent Literature 1 has an arrangement in which the electrons tend to be propagated from the light emitting dopant to a first light-emitting layer. Accordingly, the arrangement do not cause holes and respective electrons to recombine with each other at an interface between the first light-emitting layer and the second light-emitting layer. This causes a reduction in probability that holes and respective electrons recombine with each other. This ultimately causes a reduction in internal quantum yield.

According to of the organic EL element disclosed in Non-patent Literature 1, each of the first and second light-emitting layers employs, as a phosphorescent light emitting material, FIrpic which emits sky-blue light. Since an energy gap between HOMO and LUMO of the FIrpic is small, it is possible to provide an organic EL element which is driven by a low voltage and has a high light emitting efficiency. As such, in a case where a phosphorescent light emitting material which emits deep blue light is used, an energy gap between HOMO and LUMO of the phosphorescent light emitting material becomes large. It is, therefore, necessary to use a host material in which an energy gap between HOMO and LUMO is large. Accordingly, there still remains a problem that the organic EL element needs to be driven by a high voltage, even though its light emitting efficiency is unfavorably low.

The present invention has been made in view of the problem, and an object of the present invention is to provide (i) an organic EL element which is driven by a low voltage and has a high light emitting efficiency and (ii) a method for manufacturing the organic EL element.

Solution to Problem

In order to achieve the object, the organic electroluminescence element in accordance with the present invention includes: an anode; a cathode; and an organic layer provided, on a substrate, between the anode and the cathode, the organic layer including at least a light emitting layer, the light emitting layer including (i) a first light-emitting layer, provided on an anode side, which is made from a first host material which is a hole transportability host, and (ii) a second light-emitting layer, provided on a cathode side, which is made from a second host material serving as an electron transportability host, an organic light emitting material is added to each of the first host material and the second host material, a highest occupied molecular orbital (HOMO) and a lowest occupied molecular orbital (LUMO) of the first host material, HOMO and LUMO of the second host material, and HOMO and LUMO of the organic light emitting material satisfying the following relational expressions (1) and (2):

$$0\ \text{eV} < (|\text{HOMO of organic light emitting material}| - |\text{HOMO of first host material}|) \leq 0.5\ \text{eV; and} \quad (1)$$

$$0\ \text{eV} < (|\text{LUMO of second host material}| - |\text{LUMO of organic light emitting material}|) \leq 0.5\ \text{eV}. \quad (2)$$

According to the arrangement, the highest occupied molecular orbital of the host material from which the first light-emitting layer is made is shallower than that of the organic light emitting material. However, by reducing a difference (to 0.5 eV or less) between (i) the highest occupied molecular orbital of the host material from which the first light-emitting layer is made and (ii) that of the organic light emitting material, it is possible to increase a probability that holes and respective electrons recombine with each other.

Similarly, the lowest occupied molecular orbital of the host material from which the second light-emitting layer is made is deeper than that of the organic light emitting material. However, by reducing a difference (to 0.5 eV or less) between (i) the lowest occupied molecular orbital of the host material from which the second light-emitting layer is made and (ii) that of the organic light emitting material, it is possible to increase a probability that holes and respective electrons recombine with each other.

Further, in order to achieve the object, an organic electroluminescence display device in accordance with the present invention includes a display unit in which the foregoing organic electroluminescence element is formed on a thin film transistor.

According to the arrangement, it is possible to provide a display device which has high luminance, high efficiency, and a long operating life, because the display device includes an organic EL element which can drive at a low voltage and has high light emitting efficiency.

Further, in order to achieve the foregoing object, a method for manufacturing the organic electroluminescence element in accordance with the present invention, the organic electroluminescence element including an anode, a cathode, and an organic electroluminescence element provided on a substrate, between the anode and the cathode, the organic layer including at least a light emitting layer, said method includes the steps of: (i) forming the anode on the substrate, (ii) forming, on the anode, a hole injection layer to which holes are injected from the anode, (iii) forming, on the hole injection layer, a hole transport layer for transporting the holes, the holes having been injected from the anode into the organic layer, (iv) forming, on the hole transport layer, a first light-emitting layer serving as the light emitting layer, the first light-emitting layer being made from a first host material serving as a hole transportability host, (v) forming, on the first light-emitting layer, a second light-emitting layer serving as the light emitting layer, the second light-emitting layer being made from a second host material serving as an electron transportability host, (vi) forming, on the second light-emitting layer, an electron transport layer for transporting electrons, the electrons having been injected from the cathode into the organic layer, (vii) forming, on the electron transport layer, an electron injection layer to which the electrons are injected from the cathode, (viii) forming the cathode on the electron injection layer, in the steps (iv) and (v), an identical organic light emitting material being added to each of the first host material and the second host material, and the first light-emitting layer and the second light-emitting layer being formed by use of (i) the first host material, (ii) the second host material, and (iii) the organic light emitting material, the first host material, the second host material, and the organic light emitting material each having HOMO and LUMO, which satisfy the HOMO the following relational expressions (11) through (16):

$$0 \text{ eV} < (|\text{HOMO of organic light emitting material}| - |\text{HOMO of first host material}|) \leq 0.5 \text{ eV}; \quad (11)$$

$$0 \text{ eV} < (|\text{LUMO of second host material}| - |\text{LUMO of organic light emitting material}|) \leq 0.5 \text{ eV}; \quad (12)$$

$$|\text{LUMO of first host material}| < |\text{LUMO of second host material}|; \quad (13)$$

$$|\text{LUMO of first host material}| < |\text{LUMO of organic light emitting material}|; \quad (14)$$

$$|\text{HOMO of second host material}| > |\text{HOMO of first host material}|; \text{ and} \quad (15)$$

$$|\text{HOMO of second host material}| > |\text{HOMO of organic light emitting material}|. \quad (16)$$

According to the method, it is possible to provide an organic EL element which can drive at a low voltage and has high light emitting efficiency.

For a fuller understanding of the nature and advantages of the invention, reference should be made to the ensuing detailed description taken in conjunction with the accompanying drawings.

Advantageous Effects of Invention

An organic electroluminescence element of the present invention can (i) reduce holes which move toward a second light-emitting layer, without recombining with respective electrons, and (ii) reduce electrons which move toward the first light-emitting layer, without recombining with respective holes. As a result, a probability that holes and respective electrons recombine with each other is increased. It is therefore possible to reduce a driving voltage of the organic EL element. Further, the probability that holes and respective electrons recombine with each other in a light emitting layer is increased. It is therefore possible to improve internal quantum yield. This improves light emitting efficiency.

BRIEF DESCRIPTION OF DRAWINGS

FIG. 1 is a view illustrating an energy diagram of layers constituting an organic EL element in accordance with an embodiment of the present invention.

FIG. 2 is a cross-sectional view illustrating an organic electroluminescence element in accordance with an embodiment of the present invention.

FIG. 3 is a view illustrating an energy diagram of layers constituting an organic EL element in accordance with an embodiment of the present invention.

FIG. 4 is a schematic view illustrating an organic electroluminescence display device including an organic electroluminescence element in accordance with an embodiment of the present invention.

FIG. 5 is a schematic view illustrating a mobile phone which includes an organic electroluminescence display device in accordance with an embodiment of the present invention.

FIG. 6 is a schematic view illustrating a television receiver which includes an organic electroluminescence display device in accordance with an embodiment of the present invention.

FIG. 7 is a schematic view illustrating an illumination device which includes an organic electroluminescence element in accordance with an embodiment of the present invention.

FIG. 8 is a view illustrating an energy diagram of layers constituting a conventional organic EL element whose light emitting layer is made from a blue phosphorescent light emitting material.

DESCRIPTION OF EMBODIMENTS

[Embodiment 1]

(Outline of Organic EL Element 11)

Figure 2:
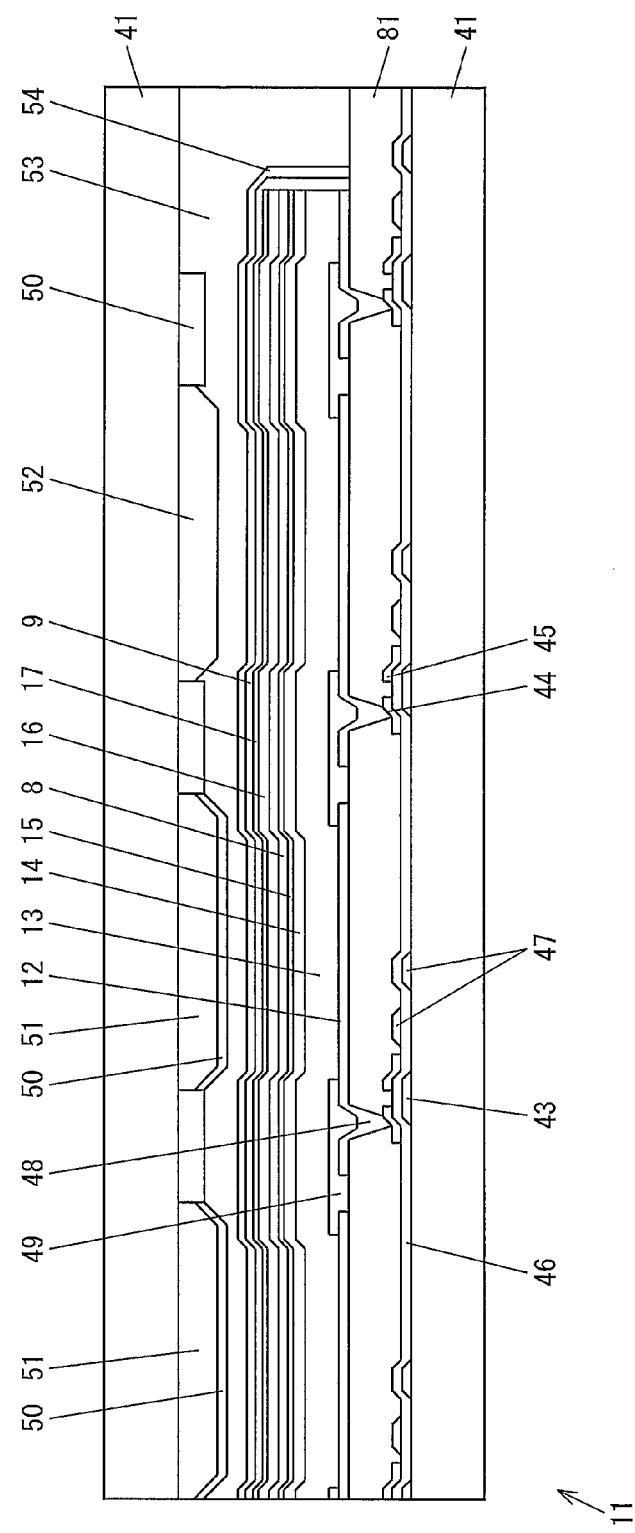
FIG. 2

An organic electroluminescence element (organic EL element) in accordance with Embodiment 1 is arranged so that (i) a pair of electrodes (anode and cathode) and (ii) an organic layer provided between the pair of electrodes, which organic layer includes a light emitting layer, are provided between a pair of substrates. More specific arrangement will be described later with reference to FIG. 2. FIG. 2 is a cross-sectional view of an organic EL element 11.

As illustrated in FIG. 2, the organic EL element 11 includes a plurality of thin film transistors (TFTs) provided at predetermined intervals. Each of the plurality of thin film transistors includes, on an insulating substrate 41, a gate electrode 43, a drain electrode 44, a source electrode 45, and a gate insulating layer 46. Further, a connecting line 47 is provided between the insulating substrate 41 on the gate electrode 43 side and the TFT.

A planarization film 81 is provided on the TFT, and a contact hole 48 is formed in the planarization film 81. Each drain electrode 44 of the TFT is electrically connected to a corresponding one of anodes 12, via a corresponding one of the contact holes 48. An edge cover 49 is provided between respective adjacent anodes 12. On a side of the anodes 12, which side is opposite to a side on which TFTs are provided, there are provided (i) an organic layer including a hole injection layer 13, a hole transport layer 14, a light emitting layer 15, a hole blocking layer 8, an electron transport layer 16, and an electron injection layer 17 and (ii) a cathode 9. The cathode 9 is covered with an inorganic sealing film 54 so that the anodes 12, the organic layer, and the cathode 9 are sealed with the inorganic sealing film 54.

Meanwhile, a light absorption layer 50, a fluorescent layer 51, and a scatterer layer 52 are formed on an insulating substrate 41 which is an insulating substrate facing the insulating substrate 41 on which the TFT is formed. There is provided a resin sealing film 53 between the two insulating substrates 41.

Note that the light emitting layer 15 of the organic EL element 11 in accordance with Embodiment 1 has a two-layer structure which is made up of a first light-emitting layer and a second light-emitting layer. The organic EL element 11 of Embodiment 1 is arranged so that an energy gap between a highest occupied molecular orbital (HOMO) and a lowest unoccupied molecular orbital (LUMO) of each of host materials from which the light emitting layer 15 is made becomes small. This makes it possible to increase a probability that holes and respective electrons recombine with each other in the light emitting layer 15, while keeping high mobility of the holes and the electrons in the organic layer. This will be described below in detail.

(Arrangement of Organic Layer)

Figure 1:
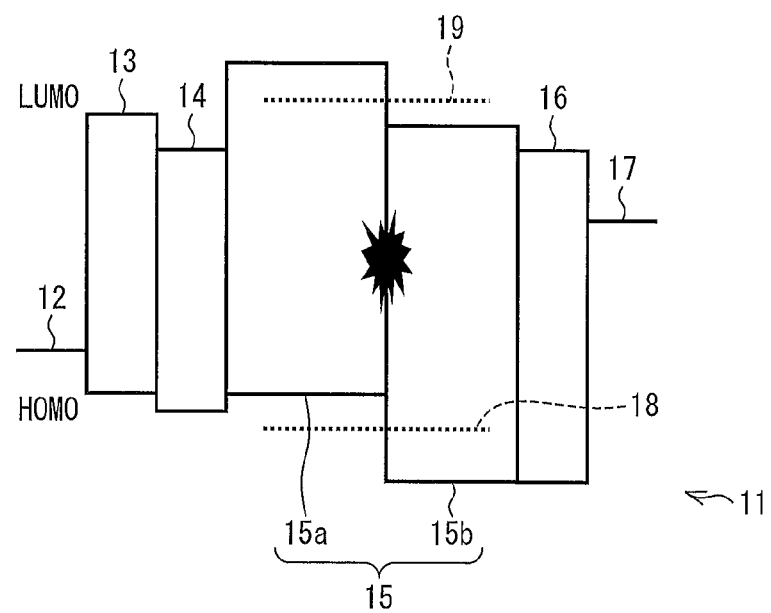
FIG. 1

The following description will discuss an arrangement of the organic layer of the organic EL element 11 with reference to FIG. 1. FIG. 1 is a view illustrating an energy diagram of layers constituting the organic EL element 11.

As early described, the organic layer of the organic EL element 11 is arranged such that the hole injection layer 13, the hole transport layer 14, the light emitting layer 15, the electron transport layer 16, and the electron injection layer 17 are formed in this order. The light emitting layer 15 has the two-layer structure made up of a first light-emitting layer 15a and a second light-emitting layer 15b. A single phosphorescent light emitting material is added to the first light-emitting layer 15a and the second light-emitting layer 15b. The first light-emitting layer 15a is provided on an anode 12 side. The first light-emitting layer 15a receives, via the hole transport layer 13, holes injected from the anode 12, and then propagates the holes to a vicinity of an interface between the first light-emitting layer 15a and the second light-emitting layer 15b. Meanwhile, the second light-emitting layer 15b is provided on a cathode (not illustrated) side. The second light-emitting layer 15b receives, via the electron transport layer 16, electrons injected from the cathode, and then propagates the electrons to the vicinity of the interface between the first light-emitting layer 15a and the second light-emitting layer 15b. Accordingly, the holes (propagated from the first light-emitting layer 15a) and the respective electrons (propagated from the second light-emitting layer 15b) meet and recombine with each other at the interface between the first light-emitting layer 15a and the second light-emitting layer 15b. This causes the organic EL element 11 to emit light.

The organic EL element 11 of Embodiment 1 is arranged so that the holes propagated via the hole transport layer 13 do not move toward the second light-emitting layer 15b and the electrons propagated via the electron transport layer 16 do not move toward the first light-emitting layer 15a. Specifically, as illustrated in FIG. 1, a material which has LUMO shallower than (i) LUMO 19 of the phosphorescent light emitting material and (ii) LUMO of a host material (second host material; electron transportability host material) from which the second light-emitting layer 15b is made is employed as a host material (first host material; hole transportability host material) from which the first light-emitting layer 15a is made (i.e., the material meets |LUMO (first host material)|<|LUMO (second host material)| and |LUMO (first host material)|<|LUMO (phosphorescent light emitting material)|). Meanwhile, a material, which has HOMO deeper than (i) HOMO 18 of the phosphorescent light emitting material and (ii) HOMO of the host material from which the first light-emitting layer 15a is made, is employed as the host material from which the second light-emitting layer 15b is made (i.e., the material meets |HOMO (second host material)|>|HOMO (first host material)| and |HOMO (second host material)|>|HOMO (phosphorescent light emitting material)|).

Accordingly, the HOMO of the host material, from which the second light-emitting layer 15b is made, is deeper than (i) the HOMO of the host material for the first light-emitting layer 15a, and (ii) the HOMO of the phosphorescent light emitting material (|HOMO (second host material)|>|HOMO (first host material)| and |HOMO (second host material)|>|HOMO (phosphorescent light emitting material)|). This makes it possible to block the holes, which has been propagated to the first light-emitting layer 15a, from moving toward the second light-emitting layer 15b. Similarly, the LUMO of the host material, from which the first light-emitting layer 15a is made, is shallower than (i) the LUMO of the host material, from which the second light-emitting layer 15b is made, and (ii) the LUMO of the phosphorescent light emitting material (|LUMO (first host material)|<|LUMO (second host material)| and |LUMO (first host material)|<|LUMO (phosphorescent light emitting material)|). This makes it possible to block the electrons, which has been propagated to the second light-emitting layer 15b, from moving toward the first light-emitting layer 15a. Accordingly, the holes and the respective electrons, propagated from the phosphorescent light emitting material, recombine with each other at the interface between the first light-emitting layer 15a and the second light-emitting layer 15b. This causes the organic EL element 11 to emit light.

According to the organic EL element 11 of Embodiment 1, (i) the light emitting layer 15 has the two-layer structure and (ii) host materials, from which the light emitting layer 15 is made, is determined by taking into consideration the HOMO and the LUMO of each of the phosphorescent light emitting material and the host materials. This makes it possible to prevent (i) the holes, injected from the anode 12, from moving toward the second light-emitting layer 15b and (ii) the electrons, injected from the cathode, from moving to the first light-emitting layer 15a. This ultimately makes it possible to reduce (i) the number of holes which move toward the second light-emitting layer 15b without recombining with the respective electrons and (ii) the number of electrons which move toward the first light-emitting layer 15a without recombining with the respective holes. It is therefore possible to increase the probability that the holes and the respective electrons recombine with each other. Since the probability that the holes and the respective electrons recombine with each other in the light emitting layer 15 can be thus increased, internal quantum yield of the organic EL element 11 of Embodiment 1 is therefore improved. This ultimately allows an improvement in light emitting efficiency of the organic EL element 11.

An organic EL element employing a conventional blue phosphorescent light emitting material has a problem that light emitting efficiency of the organic EL element is low even though the organic EL element needs a high driving voltage. Embodiment 1, however, can prevent (i) the holes from moving toward the second light-emitting layer 15b and (ii) the electrons from moving toward the first light-emitting layer 15a, even in a case where the blue phosphorescent light emitting material is used. Namely, since the probability that the holes and the respective electrons recombine with each other is increased, the internal quantum yield can be improved. This ultimately allows an improvement in the light emitting efficiency.

(Substrate of Organic EL Element 11)

The following description will discuss below components constituting the organic EL element 11. As early described, the organic EL element 11 includes, between the anode 12 and the cathode which are formed between the pair of substrates (not illustrated), the organic layer which is made up of the hole injection layer 13, the hole transport layer 14, the light emitting layer 15, the electron transport layer 16, and the electron injection layer 17.

The substrate will be first described below. The substrate of the organic EL element 11 is not limited to a specific one, provided that it has an insulation property. A material usable for the substrate of the organic EL element 11 is not particularly limited. For example, a well-known insulating substrate-material can be used as the material.

Examples of the material for the substrate encompass (i) an inorganic material substrate made from a material such as a glass or quartz, (ii) a plastic substrate made from a material such as polyethylene terephthalate or polyimide resin, (iii) a substrate such as a metal substrate which is made from a material such as aluminum (Al) or iron (Fe) and is coated with an insulator made from a material such as silicon oxide or an organic insulating material, and (iv) a substrate such as a metal substrate which is made from a material such as Al and whose surface is subjected to an insulation process by a method such as an anodic oxidation method.

Note that the substrate on the anode side is preferably made from a material which does not transmit light in a case where light emitted from the light emitting layer 15 of the organic EL element 11 is sent out from the substrate on the cathode side, i.e., in a case where the organic EL element is of a top-emission type. For example, a semiconductor substrate such as a silicon wafer can be used. On the contrary, in a case where light emitted from the light emitting layer 15 of the organic EL element 11 is sent out from the substrate on the anode side, i.e., in a case where the organic EL element is of a bottom-emission type, the substrate on the anode side is preferably made from a material which can transmit light. A substrate such as a glass substrate or a plastic substrate can be used.

(Electrode of Organic EL Element 11)

The following description will discuss electrodes. The electrodes constituting the organic EL element 11 only need to function as a pair (for example, the anode 12 and the cathode). Each of the electrodes can have a single layer structure made from a single electrode material or can have a stacked structure made from a plurality of electrode materials. An electrode material can be used as a materials for an electrode of the organic EL element 11 is not particularly limited. For example, a well-known electrode material can be used.

Examples of the anode 12 encompass (i) a metal such as gold (Au), platinum (Pt), or nickel (Ni) and (ii) a transparent electrode material such as indium tin oxide (ITO), tin oxide ($SnO_2$), or indium zinc oxide (IZO).

Examples of the cathode encompass (i) a metal such as lithium (Li), calcium (Ca), cerium (Ce), barium (Ba), or aluminum (Al), or (ii) alloys such as a magnesium (Mg):silver (Ag) alloy containing those metals or an Li:Al alloy.

It is necessary to send out the light (which has been emitted from the light emitting layer 15 of the organic EL element 11) from an electrode side of one of the anode 12 and the cathode. In this case, it is preferable that one of the electrodes is made from an electrode material which can transmit the light and the other of the electrodes is made from an electrode material which does not transmit the light. Examples of the electrode material which does not transmit the light encompass (i) a black electrode made from a material such as tantalum or carbon and (ii) reflective metal electrodes made from Al, Ag, Au, an Al:Li alloy, an Al:neodymium (Nd) alloy, or an Al:silicone (Si) alloy.

(Organic Layer of Organic EL Element 11)

The following description will discuss the organic layer. The organic layer includes, the hole injection layer 13, the hole transport layer 14, the light emitting layer 15, the electron transport layer 16, and the electron injection layer 17.

The light emitting layer 15 will be first described below. As early described, the light emitting layer 15 has a two-layer structure which is made up of the first light-emitting layer 15a and the second light-emitting layer 15b. A single phosphorescent light emitting material is added to each of the first and second light-emitting layers 15a and 15b. The phosphorescent light emitting material, which can be used as a material for the light emitting layer 15, is not particularly limited. For example, a well-known phosphorescent light emitting material can be used.

Examples of the blue phosphorescent light emitting material encompass: Ir complex such as iridium(III)bis(4',6'-difluorophenylpyridinato)tetrakis(1-pyrazolyl)borate (FIr6) (HOMO=6.1 eV, LUMO=3.1 eV, $T_1$=2.71 eV), iridium (III) bis[4,6-(di-fluorophenyl)-pyridinato-N,C2']picolinate (FIrpic), Ir(cn-pmic)$_3$, tris((3,5-difluoro-4-cyanophenyl)pyridine)iridium (FCNIr), or Ir(cnbic)$_3$; complexes of heavy metal atom such as platinum (Pt), rhenium (Re), ruthenium (Ru), copper (Cu), or osmium (Os).

In order to prevent the electrons from moving toward the first light-emitting layer 15a from the second light-emitting layer 15b, the host material from which the first light-emitting layer 15a is made meets the following requirement: LUMO of the host material from which the first light-emitting layer 15a is made is shallower than (i) the LUMO of the phosphorescent light emitting material and (ii) the LUMO of the host material from which the second light-emitting layer 15b is made. Accordingly, a host material, which can be used as a material for the second light-emitting layer 15b in Embodiment 1 and meet the above requirement, can be used as the host material from which the first light-emitting layer 15a is made. This makes it possible to prevent the electrons from moving toward the first light-emitting layer 15a.

Note that the HOMO of the host material from which the first light-emitting layer 15a is made is preferably shallower than the HOMO 18 of phosphorescent light emitting material. It is, further, preferable that a difference between (i) the HOMO of the host material for the first light-emitting layer 15a and (ii) the HOMO 18 of the phosphorescent light emitting material is 0.5 eV or less. This is based on the fact that the holes and the electrons of the organic EL element are transported by the hopping conduction. Mobility of a hole is reduced as $\exp(-\Delta E/RT)$ (R: gas constant, T: absolute temperature [K]) while the holes and the electrons are transported by the hopping conduction, where "$\Delta E$" indicates a difference between (i) an energy in which the holes are trapped and (ii) an energy in which the holes hop. As such, a probability that the holes are thermally excited is increased in a case where the difference between (i) the HOMO of the host material for the first light-emitting layer 15a, and (ii) the HOMO 18 of the phosphorescent light emitting material is 0.5 eV or less. This allows an increase in the probability that the holes and the respective electrons recombine with each other. The value of 0.5 eV or less can be explained by using the Arrhenius equation. The application of electric field causes the holes to be less apt to move toward a material for an anode, from the host material for the first light-emitting layer 15a. That is, the holes move toward the phosphorescent light emitting material from the host material for the first light-emitting layer 15a in a case where the difference between (i) the HOMO of the host material for the first light-emitting layer 15a and (ii) the HOMO 18 of the phosphorescent light emitting material is 0.5 eV or less.

Further, in a case where the difference between (i) the HOMO of the host material for the first light-emitting layer 15a, and (ii) the HOMO 18 of the phosphorescent light emitting material is more than 0 eV, it is possible to reduce an energy gap between the HOMO and the LUMO of the host material. This ultimately gives rise to a low driving voltage of a device which includes the organic EL element 11.

In order to confine an excited energy within the phosphorescent light emitting material, it is preferable to use, as a material of the first light-emitting layer 15a, a host material which has a $T_1$ larger than a $T_1$ of the phosphorescent light emitting material for the light emitting layer 15. Note that, even in a case where $T_1$ of the host material is smaller than $T_1$ of the phosphorescent light emitting material but a difference between the $T_1$ of the host material and the $T_1$ of the phosphorescent light is approximately 0.1 eV, an excited energy is less apt to move from the phosphorescent light emitting material. It is therefore possible to use the host material whose $T_1$ is smaller, by approximately 0.1 eV, than the $T_1$ of the phosphorescent light emitting material.

For example, 2,2-bis(4-carbazolylphenyl)-1,1-biphenyl (4CzPBP) (HOMO=6.0 eV, LUMO=2.5 eV, $T_1$=3.0 eV), 1,3-bis(carbazole-9-yl)benzene (mCP) (HOMO=5.9 eV, LUMO=2.4 eV, $T_1$=2.9 eV), or adamantane carbazole (AdCz) (HOMO=5.8 eV, LUMO=2.6 eV, $T_1$=2.88 eV) can be used as the host material for the first light-emitting layer 15a. Note, however, that the host material is not particularly limited to this. Further, since it is necessary that the host material for the first light-emitting layer 15a has hole transportability, a hole transportable material for the hole transport layer of the organic EL element employing a conventional blue phosphorescent light emitting material can be used, without any problems, as the host material for the first light-emitting layer 15a.

The following description will discuss the second light-emitting layer 15b. In order to prevent the holes from moving toward the second light-emitting layer 15b from the first light-emitting layer 15a, the host material from which the second light-emitting layer 15b is made meets the following requirement: HOMO of the host material from which the second light-emitting layer 15b is made is deeper than (i) the HOMO of the phosphorescent light emitting material and (ii) the HOMO of the host material for the first light-emitting layer 15a. Accordingly, a host material which can be used as a material for the second light-emitting layer 15b of Embodiment 1 and meets the above requirement, can be used as the host material from which the first light-emitting layer 15a is made. This makes it possible to prevent the holes from moving toward the second light-emitting layer 15b.

Note that the LUMO of the host material for the second light-emitting layer 15b, is preferably deeper than the LUMO 19 of the phosphorescent light emitting material. It is further preferable that the difference between (i) the LUMO of the host material for the second light-emitting layer 15b, and (ii) the LUMO 19 of the phosphorescent light emitting material is 0.5 eV or less.

Similar to the energy difference indicated by the difference between (i) the HOMO of the host material for the first light-emitting layer 15a, and (ii) the HOMO 18 of the phosphorescent light emitting material as early described, the application of electric field causes the electrons to be less apt to move toward the material for a cathode from the host material for the second light-emitting layer 15b, in a case where the difference is 0.5 eV or less. That is, the electrons move, to the phosphorescent light emitting material, from the host material for the second light-emitting layer 15b in a case where the difference between (i) the LUMO of the host material for the second light-emitting layer 15b and (ii) the LUMO 19 of the phosphorescent light emitting material is 0.5 eV or less.

Further, in a case where the difference (i) between the LUMO of the host material for the second light-emitting layer 15b and (ii) the LUMO 19 of the phosphorescent light emitting material is more than 0 eV, it is possible to reduce an energy gap between the HOMO and the LUMO of the host material. This ultimately gives rise to a low driving voltage of the device.

In order to confine an excited energy within the phosphorescent light emitting material, it is preferable to use, as a host material of the second light-emitting layer 15b, a host material which has a $T_1$ larger than a $T_1$ of the phosphorescent light emitting material for the light emitting layer 15. Note that, even in a case where $T_1$ of the host material is smaller than $T_1$ of the phosphorescent light emitting material but a difference between the $T_1$ of the host material and the $T_1$ of the phosphorescent light is approximately 0.1 eV, an excited energy is less apt to move from the phosphorescent light emitting material. It is therefore possible to use the host material whose $T_1$ is smaller, by approximately 0.1 eV, than $T_1$ of the phosphorescent light emitting material.

For example, tris(2,4,6-trimethyl-3-(pyridine-3-yl)phenyl)borane (3TPYMB) (HOMO=6.8 eV, LUMO=3.3 eV, $T_1$=2.98 eV), or 1,3,5-tri(m-pyridine-3-yl-phenyl)benzene (TmTyPB) (HOMO=6.68 eV, LUMO=2.73 eV, $T_1$=2.78 eV) can be used as the host material for the second light-emitting layer 15b. Note, however, that the host material is not particularly limited to this. Further, since it is necessary that the host material for the second light-emitting layer 15b has electron transportability, an electron transportable material for the electron transport layer of the organic EL element employing a conventional blue phosphorescent light emitting material can be used, without any problems, as the host material for the second light-emitting layer 15b.

The host materials which can be used as materials for the first light-emitting layer 15a and the second light-emitting layer 15b have been described so far. Note, however, that the host material is not necessarily limited to such host materials. For example, it is possible to appropriately select host materials, each of which meets the foregoing conditions, for the first light-emitting layer 15a and the second light-emitting layer 15b after having determined the phosphorescent light emitting material employed in the organic EL element 11. The host material is thus not limited to the host materials exemplified in the description, provided that the host material meets the conditions. Accordingly, it is possible to determine a host material to be used, by taking into consideration (i) a combination of host materials for the respective layers of the organic EL element 11, (ii) the phosphorescent light emitting material employed in the organic EL element 11, and the like. Also note that the host materials to be used are not limited to two kinds. Namely, at least two kinds of host material, i.e., a plurality of host materials can be used.

The following description will discuss the hole injection layer 13. A hole-injection-property material which can be used as a material for the hole injection layer 13 is not particularly limited. For example, it is possible to use a well-known hole-injection-property material. For example, it is possible to use, as the hole-injection-property material, 4,4'-bis[N-(1-naphthyl)-N-phenyl-amino]biphenyl($\alpha$-NPD), di-[4-(N,N-ditolyl-amino)-phenyl]cyclohexane (TAPC), 9,10-diphenylanthracene-2-sulfonate (DPAS), N,N'-diphenyl-N, N'-(4-(di(3-tolyflamino)phenyl)-1,1'-biphenyl-4,4'-diamine (DNTPD), iridium(III)tris[N,N'-diphenylbenzimidazole-2-ylidene-C2,C2'] (Ir(dpbic)$_3$), 4,4',4''-tris-(N-carbazolyl)-triphenylamine (TCTA), 2,2-bis(p-trimelliticoxyphenyl)propanoic anhydride (BTPD), bis[4-(p,p-ditolylamino)phenyl] diphenylsilane (DTASi), or the host materials for use in the first light-emitting layer 15a.

Then, the following description will discuss the hole transport layer 14. A hole transporting material which can be used as a material for the hole transport layer 14 is not particularly limited. For example, it is possible to use a well-known hole transporting material such as TAPC, DPAS, DNTPD, Ir(dpbic)$_3$, TCTA, BTPD, DTASi, or a host material for the first light-emitting layer 15a.

The following description will discuss the electron transport layer 16. An electron transporting material which can be used as a material for the electron transport layer 16 is not particularly limited. For example, a well-known electron transporting material can be used. For example, 2,9-dimethyl-4,7-diphenyl-1,10-phenanthroline (BCP), 1,3,5-tris(N-phenylbenzimidazole-2-yl)benzene (TPBI), 3-phenyl-4(1'-naphthyl)-5-phenyl-1,2,4-triazole (TAZ), 4,7-diphenyl-1,10-phenanthroline (Bphen), Ad-Cz, dipalmitoylphosphatidylserine (DPPS), 1,3,5-tri(m-pyrid-3-yl-phenyl)benzene (TmPyPB), 1,3,5-tri(p-pyrid-3-yl-phenyl)benzene (TpPyPB), the host materials for use in the second light-emitting layer 15b, or the like can be used.

Lastly, the following description will discuss the electron injection layer 17. An electron-injection-property material which can be used as a material for the electron injection layer 17 is not particularly limited. For example, it is possible to use a well-known electron-injection-property material such as LiF, BCP, TPBI, TAZ, Bphen, Ad-Cz, DPPS, TmPyPB, TpPyPB, or a host material for the second light-emitting layer 15b.

(Steps of Manufacturing Organic EL Element 11)

Steps of manufacturing the organic EL element 11 will be described briefly. As early described, an organic EL element normally includes a transistor serving as a switching device. Note, however, that Embodiment 1 will not describe how to manufacture the transistor.

The following description will discuss a step of forming anodes 12, an organic layer, and a cathode on a substrate on which a plurality of transistors have been formed so as to have an island shape. First, each of the anodes 12 is patterned on a corresponding one of the transistors (step of forming anode). Then, each organic layer which is made up of layers is formed on a corresponding one of the anodes 12. Note that an organic insulating film (not illustrated) can be further formed around the anodes 12 so as to ensure an insulating property around the anodes 12. The organic insulating film is preferably made from a resin material such as polyimide resin material. However, the organic insulating film is not particularly limited to such organic insulating film. For example, a well-known organic insulating material can be used.

Then, a hole injection layer 13 is formed (step of forming hole injection layer). A hole-injection-property material is deposited on the anodes 12. The hole injection layer 13 is preferably deposited so as to have a film thickness of approximately 45 nm. The hole injection layer 13 is thus formed.

Subsequently, a hole transport layer 14 is formed (step of forming hole transport layer). A hole transporting material is deposited on the hole injection layer 13. The hole transport layer 14 is preferably deposited so as to have a film thickness of approximately 15 nm. The hole transport layer 14 is thus formed.

The light emitting layer 15 is then formed. Specifically, a host material for the first light-emitting layer 15a and a phosphorescent light emitting material are co-deposited on the hole transport layer 14 (step of forming first light-emitting layer). During the depositing, it is preferable that the phosphorescent light emitting material is added to the host material so that the host material contains the phosphorescent light emitting material of approximately 7.5%. The first light-emitting layer 15a is thus formed. Note that the light emitting layer 15a is preferably deposited so as to have a film thickness of approximately 10 nm.

Thereafter, a host material for the second light-emitting layer 15b and a phosphorescent light emitting material are co-deposited on the first light-emitting layer 15a (step of forming second light-emitting layer). During the co-depositing, During the depositing, it is preferable that the phosphorescent light emitting material is added to the host material so that the host material contains the phosphorescent light emitting material of approximately 7.5%. The second light-emitting layer 15b is thus formed. Note that the second light-emitting layer 15b is preferably deposited so as to have a film thickness of approximately 10 nm.

Subsequently, an electron transport layer 16 is formed (step of forming electron transport layer). An electron transporting material is deposited on the light emitting layer 15. The electron transport layer 16 is preferably deposited so as to have a film thickness of approximately 30 nm. The electron transport layer 16 is thus formed.

Next, an electron injection layer 17 is formed (step of forming electron injection layer). An electron-injection-property material is deposited on the electron transport layer 16. The electron injection layer 17 is thus formed.

Lastly, a cathode is formed (step of forming cathode). The cathode is patterned and formed on the electron injection layer 17. The organic EL element 11 is thus formed.

[Embodiment 2]

(Outline of Organic EL Element 21)

As early described, since it is necessary that the host material for the first light-emitting layer 15a have hole transportability, the hole transportable material for the hole transport layer of the organic EL element employing a conventional blue phosphorescent light emitting material can be used, without any problems, as the host material for the first light-emitting layer 15a. As such, by using a hole transportable material as the host material for the first light-emitting layer 15a, the first light-emitting layer 15a can also serve as the hole transport layer 14. Similarly, since it is necessary that the host material for the second light-emitting layer 15b has electron transportability, the electron transportable material for the electron transport layer of the organic EL element employing a conventional blue phosphorescent light emitting material can be used without any problems, as the host material for the second light-emitting layer 15b. As such, by using the electron transportable material as the host material for the second light-emitting layer 15b, the second light-emitting layer 15b can also serve as the electron transport layer 16. The following description will discuss an outline of an organic EL element in which (i) a first light-emitting layer also serves as a hole transport layer and (ii) a second light-emitting layer also serves as an electron transport layer. Embodiment 2 is similar to Embodiment 1, except that the first light-emitting layer also serves as the hole transport layer and the second light-emitting layer also serves as the electron transport layer.

The organic EL element of Embodiment 2 includes an organic layer between an anode and an cathode formed between a pair of substrates. The organic layer is arranged such that a hole injection layer, a light emitting layer, and an electron injection layer are formed in this order. The light emitting layer has a two-layer structure made up of a first light-emitting layer and a second light-emitting layer. The organic EL element of Embodiment 2 is arranged so that an energy gap between a highest occupied molecular orbital (HOMO) and a lowest unoccupied molecular orbital (LUMO) of a host material, from which a light-emitting layer is made, becomes small. This makes it possible to increase a probability that holes and respective electrons recombine with each other in the light-emitting layer 15 while keeping high mobility of the holes and the electrons in the organic layer. This will be described below in detail.

Note that the organic EL element normally includes a transistor (not illustrated) serving as a switching device of an organic thin film transistor substrate etc. However, the present embodiment will not describe detailed description of the transistor.

(Arrangement of Organic Layer)

Figure 3:
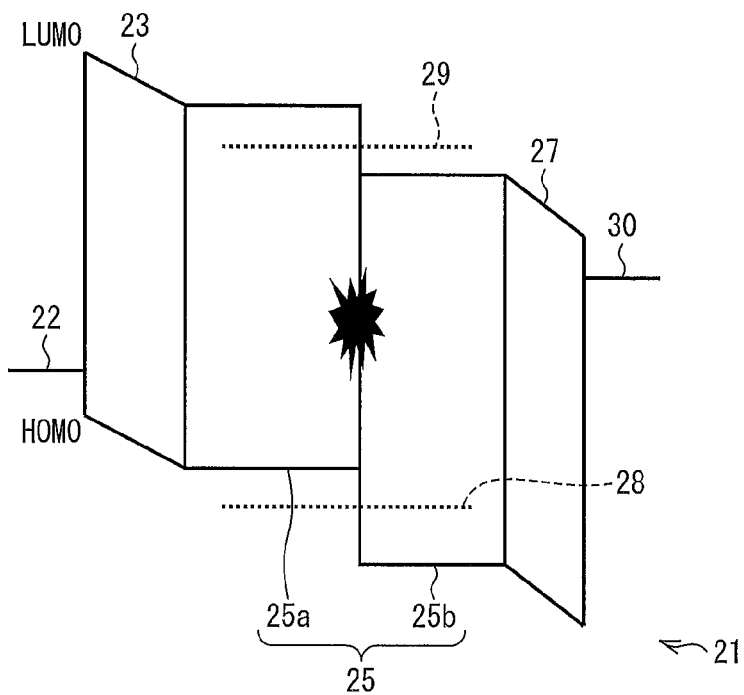
FIG. 3

The following description will discuss an arrangement of an organic layer of an organic EL element 21 with reference to FIG. 3. FIG. 3 is a view illustrating an energy diagram of layers constituting the organic EL element 21.

As early described, the organic layer of the organic EL element 21 is arranged such that a hole injection layer 23, a light emitting layer 25, and an electron injection layer 27 are formed in this order. The light emitting layer 25 has the two-layer structure made up of a first light-emitting layer 25a and a second light-emitting layer 25b. A single phosphorescent light emitting material is added to the first light-emitting layer 25a and the second light-emitting layer 25b. The first light-emitting layer 25a receives, via the hole injection layer 23, holes injected from an anode 22, and then propagates the holes to the vicinity of an interface between the first light-emitting layer 25a and the second light-emitting layer 25b. Meanwhile, the second light-emitting layer 25b receives, via the electron injection layer 27, electrons injected from a cathode 30, and then propagates the electrons to the vicinity of the interface between the first light-emitting layer 25a and the second light-emitting layer 25b. Accordingly, the holes (propagated from the first light-emitting layer 25a) and the electrons (propagated from the second light-emitting layer 25b) meet and recombine with each other at the interface between the first light-emitting layer 25a and the second light-emitting layer 25b. This causes the organic EL element to emit light.

Note that a host material for the organic layer of the organic EL element 21 is selected similarly to Embodiment 1. Specifically, as illustrated in FIG. 3, a material which has LUMO shallower than (i) LUMO 29 of the phosphorescent light emitting material and (ii) LUMO of a host material, from which the second light-emitting layer 25b is made, is employed as a host material from which the first light-emitting layer 25a is made (i.e., the material meets |LUMO (first host material)|<|LUMO (second host material)| and |LUMO (first host material)|<|LUMO (phosphorescent light emitting material)|). Meanwhile, a material which has HOMO deeper than (i) HOMO 28 of the phosphorescent light emitting material and (ii) HOMO of the host material, from which the first light-emitting layer 25a is made is employed as the host material, from which the second light-emitting layer 25b is made (i.e., the material meets |HOMO (second host material)|>|HOMO (first host material)| and |HOMO (second host material)|>|HOMO (phosphorescent light emitting material)|).

This makes it possible to block (i) the holes, which has been propagated to the first light-emitting layer 25a, from moving toward the second light-emitting layer 25b and (ii) the electrons, which has been propagated to the second light-emitting layer 25b, from moving to the first light-emitting layer 25a. This ultimately makes it possible to reduce (i) the number of holes which move toward the second light-emitting layer 25b without recombining with the respective electrons and (ii) the number of electrons which move toward the first light-emitting layer 25a without recombining with the respective holes. It is therefore possible to increase the probability that the holes and the respective electrons recombine with each other. Since the probability that the holes and the respective electrons recombine with each other in the light emitting layer 25 can be thus increased, internal quantum yield of the organic EL element 21 of Embodiment 2 is therefore improved. This ultimately allows an improvement in light emitting efficiency.

According to Embodiment 2, the first light-emitting layer 25a also serves as the hole transport layer, and the second light-emitting layer 25b serves as the electron transport layer. It is therefore possible to simplify a layer structure of the organic EL element 21. This ultimately allows a manufacturing process of the organic EL element 21 to be simplified. Further, since it is unnecessary to provide the injection layers and the transport layers separately, it is possible to reduce manufacturing cost of the organic EL element 21.

(Hole Injection Layer 23 and Electron Injection Layer 27 in Organic EL Element 21)

As early described, in the organic EL element 21 of Embodiment 2, the first light-emitting layer 25a also serves as the hole transport layer and the second light-emitting layer 25b also serves as the electron transport layer. In order to improve injection of the holes into the hole injection layer 23, p-dopant can be added to the hole injection layer 23. Similarly, in order to improve injection of the electrons into the electron injection layer 27, n-dopant can be added to the electron injection layer 27. This promotes (i) the injection of the holes into the hole injection layer and (ii) the injection of the electrons into the electron injection layer. Accordingly, it is possible to propagate the holes and the electrons enough to the light emitting layer.

Note that, in this case, a region made only from a host material can be provided between the light emitting layer 25 and the hole injection layer 23. The region serves as an electron blocking layer, and can prevent energy deactivation from occurring, due to exciplex, at an interface between the light emitting layer 25 and the hole injection layer 23. To put it another way, it is possible to prevent energy loss occurred during movements of the respective holes from the light emitting layer 25 to the hole injection layer 23. Similarly, a region made only from the host material can be provided as a hole blocking layer between the light emitting layer 25 and the electron injection layer 27. Note that each of the electron blocking layer and the hole blocking layer preferably has a film thickness of approximately 10 nm.

Furthermore, the host material for the first light-emitting layer 25a can be used as a material for the hole injection layer 23. Similarly, the host material for the second light-emitting layer 25b can be used as a material for the electron injection layer 27. This makes it possible to simplify the manufacturing process of the organic EL element 21. Further, it is possible to reduce a material required for the organic EL element 21. This makes it possible to reduce more manufacturing cost of the organic EL element 21.

(Steps of Manufacturing Organic EL Element 21)

Steps of manufacturing the organic EL element 21 will be described briefly. As early described, an organic EL element normally includes a transistor serving as a switching device. Note, however, that how to manufacture the transistor will not be described in detail in Embodiment 2.

The step of forming anodes 22 on the substrate and the steps to be carried out before the step are similar to those in Embodiment 1, and therefore their description is omitted. The following description will discuss (i) a step of forming an organic layer on the anode 22 and (ii) steps to be carried out after the step.

First, a hole injection layer 23 is formed. Specifically, a hole-injection-property material and p-dopant are co-deposited on the anode 22. It is preferable that the p-dopant is added to the hole-injection-property material so that the hole-injection-property material contains the p-dopant of approximately 10%. The hole injection layer 23 is thus formed. Note that the hole injection layer 23 is preferably formed so as to have a film thickness of approximately 50 nm.

Subsequently, a host material for the first light-emitting layer 25a and a phosphorescent light emitting material are co-deposited on the hole injection layer 23 (step of forming first light-emitting layer). It is preferable that the phosphorescent light emitting material of approximately 7.5% is added to the host material so that the host material contains the phosphorescent light emitting material of approximately 7.5%. The first light-emitting layer 25a is thus formed. Note that the first light-emitting layer 25a is preferably formed so as to have a film thickness of approximately 10 nm.

Subsequently, a host material for the second light-emitting layer 25b and a phosphorescent light emitting material are co-deposited on the second light-emitting layer 25b (step of forming second light-emitting layer). It is preferable that the phosphorescent light emitting material is added to the host material so that the host material contains the phosphorescent light emitting material of approximately 7.5%. The first light-emitting layer 25b is thus formed. Note that the second light-emitting layer 25b preferably is formed so as to have a film thickness of approximately 10 nm.

Then, an electron injection layer 27 is formed (step of forming electron injection layer). An electron-injection-property material and an n-dopant are co-deposited on the light emitting layer 25. It is preferable that the n-dopant is added to the electron-injection-property material so that the electron-injection-property material contains the n-dopant of approximately 50%. The electron injection layer 27 is thus formed. Note that the electron injection layer 27 preferably is formed so as to have a film thickness of approximately 30 nm.

Lastly, a cathode 30 is formed (step of forming cathode). The cathode 30 is patterned and formed on the electron injection layer 27. The organic EL element 21 is thus formed.

The present invention is not limited to the description of the embodiments above, and can be modified in numerous ways by a skilled person as long as such modification falls within the scope of the claims. An embodiment derived from a proper combination of technical means disclosed in different embodiments is also encompassed in the technical scope of the present invention.

For example, Embodiments 1 and 2 have described the case where the blue phosphorescent light-emitting material is used as the phosphorescent light-emitting material. It is, however, possible to employ, as the phosphorescent light emitting material, other organic light emitting materials such as (i) phosphorescent light emitting materials other than the blue phosphorescent light emitting material and (ii) fluorescent light emitting materials. It is possible to realize a further reduction in a driving voltage even in a case where an organic light emitting material other than the blue phosphorescent light emitting material is used as each of the organic EL elements 11 and 21 of Embodiments 1 and 2, respectively.

Further, Embodiment 2 has described the case where a dopant is added to each of the hole injection layer 23 and the electron injection layer 27. Similarly, a dopant can be added to each of the hole injection layer 13 and the electron injection layer 17 of Embodiment 1. Furthermore, a dopant can be added to each of the hole transport layer 14 and the electron transport layer 16, for the purpose of promoting transportation of holes and electrons. This will not cause any problem.

Figure 4:
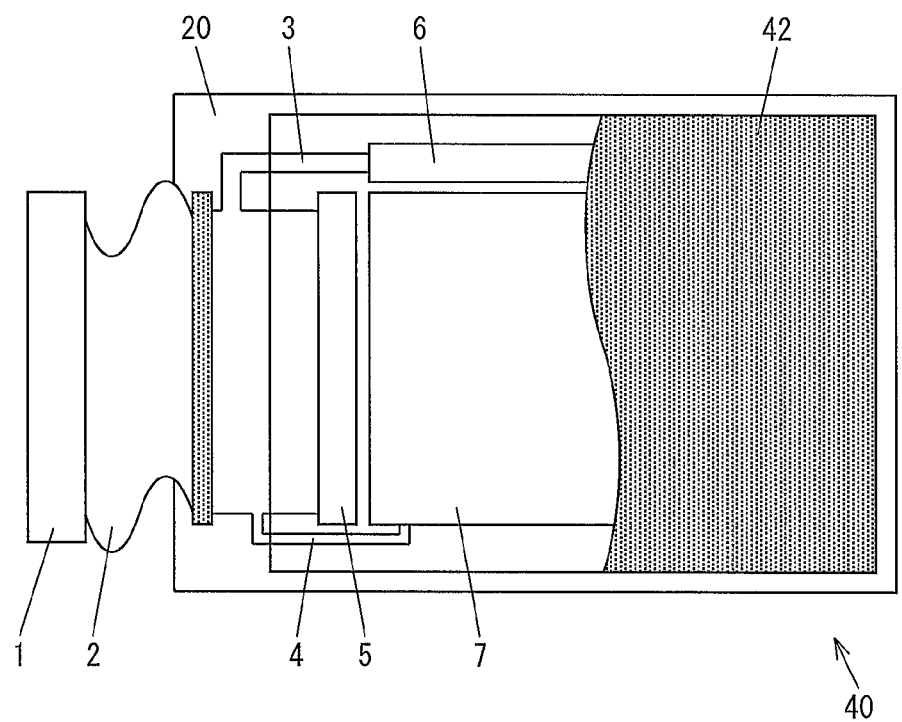
FIG. 4

In addition, it is possible to realize an organic EL display device including display means which includes the organic EL element 11 or 21 in accordance with Embodiment 1 or 2, respectively. A specific example of such an organic EL display device is illustrated in FIG. 4. FIG. 4 schematically illustrates an organic EL display device 40 including the organic EL element 11 or 21.

As illustrated in FIG. 4, the organic EL display device 40 including the organic EL element 11 or 21 includes, on a substrate 20, a pixel section 7, a gate-signal-side driving circuit 5, a data-signal-side driving circuit 6, wiring 3, a current supply line 4, a sealing substrate 42, an FPC (Flexible Printed Circuit) 2, and an external driving circuit 1.

The external driving circuit 1 controls (i) the gate-signal-side driving circuit 5 to sequentially select scanning lines of the pixel section 7 and (ii) the data-signal-side driving circuit 6 to write pieces of pixel data into respective pixel elements aligned along a selected scanning line. Specifically, the gate-signal-side driving circuit 5 sequentially drives the scanning lines and the data-signal-side driving circuit 6 outputs the pixel data to data lines. This causes pixel elements to be driven. The pixel elements are provided at an intersection of (i) a driven scanning line and (ii) respective data lines to which pieces of data are outputted.

Figure 5:
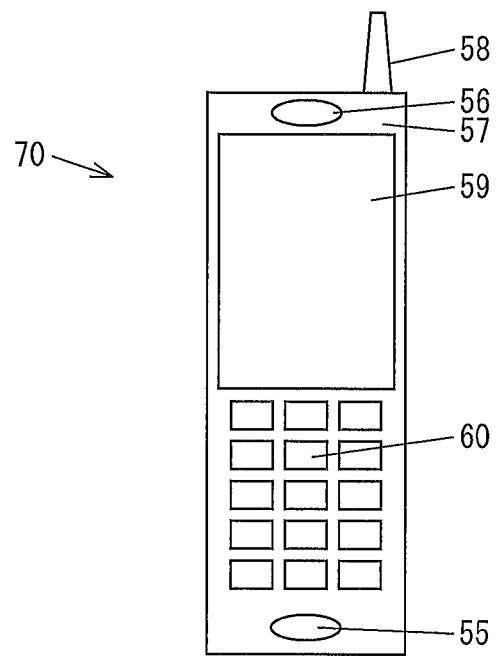
FIG. 5
Figure 6:
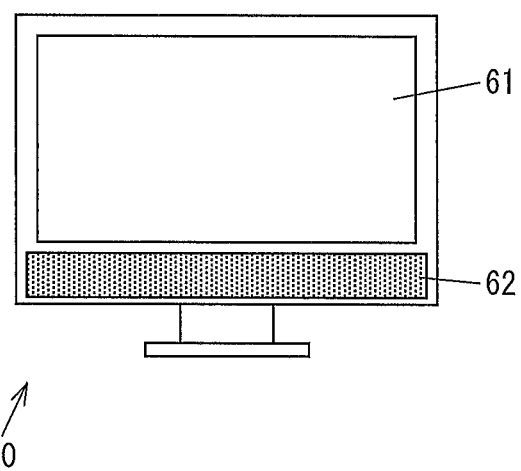
FIG. 6

It is further possible to realize an electronic device including the foregoing organic EL display device. Specific examples of the electronic device are illustrated in FIG. 5 and FIG. 6. FIG. 5 is a schematic view of a mobile phone 70 including the organic EL display device. FIG. 6 is a schematic view of a television receiver 80 including the organic electroluminescence display device As illustrated in FIG. 5, it is possible to mount, on a display section 59 of the mobile phone 70, the organic EL display device including the organic EL element 11 or 21 in accordance with Embodiment 1 or 2, respectively. Note that a sound input section 55, a sound output section 56, a main body section 57, an antenna 58, an operation switch 60 are illustrated in FIG. 5. These components have functions similar to those of conventional mobile phones, and are therefore not described here. Furthermore, no specific arrangement of the mobile phone 70 will be described.

As illustrated in FIG. 6, it is also possible to mount, on a display section 61 of the television receiver 80, an organic EL display device including the organic EL element 11 or 21 in accordance with Embodiment 1 or 2. Note that a speaker 62 is illustrated in FIG. 6. The television receiver 80 has an arrangement similar to that of a conventional television receiver 80, except that the television receiver 80 includes, in the display section 61, the organic EL display device. Therefore, a specific arrangement of the television receiver 80 will not be described.

As early described, since the organic EL display device includes the organic EL element 11 or 21 of Embodiment 1 or 2, respectively, the organic EL display device can realize high light emitting efficiency. Such organic EL display device can be mounted on various kinds of electronic device including a display section.

Figure 7:
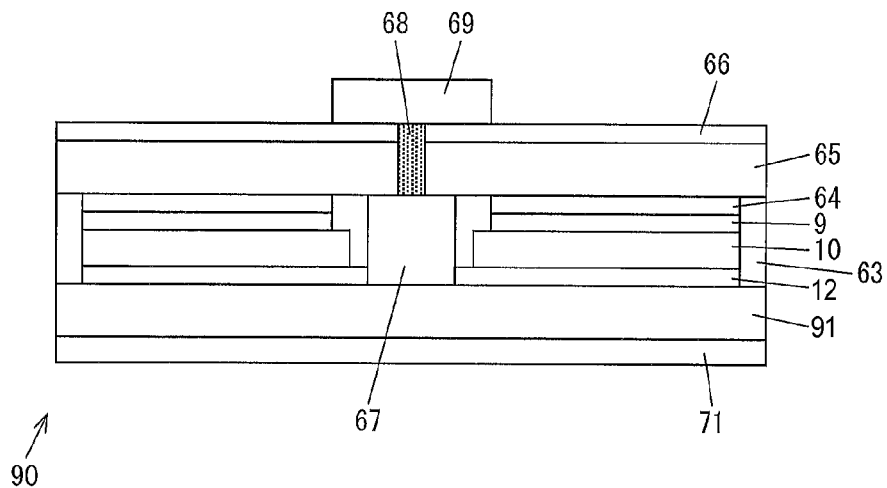
FIG. 7
Figure 8:
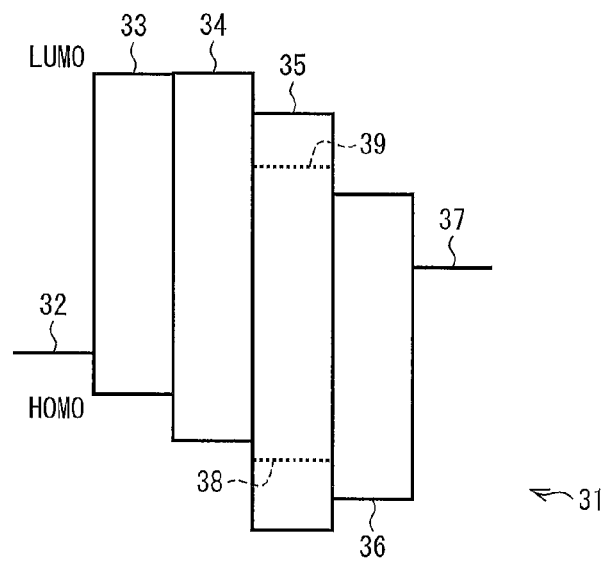
FIG. 8

Note that the organic EL display device including the display means which includes the organic EL element 11 or 21 in accordance with Embodiment 1 or 2, respectively, has been described so far. Embodiments 1 and 2 are, however, not limited to such organic EL display. Alternatively the organic EL element 11 or 21 can be utilized as a light source of an illumination device. A specific example of the organic EL element 11 or 21 utilized as a light source of the illumination device will be illustrated in FIG. 7. FIG. 7 is a schematic view of an illumination device 90 including the organic EL element 11 or 21.

As illustrated in FIG. 7, the illumination device 90 including the organic EL element 1 includes an optical film 71, a substrate 91, an anode 12, an organic EL layer 10, a cathode 9, a thermal diffusion sheet 64, a sealing substrate 65, a sealing resin 63, a heat dissipation member 66, a driving circuit 67, wiring 68, and a ceiling plug 69.

As early described, since the organic EL display device includes the organic EL element 1 of Embodiment 1 or 2, the illumination device can realize high light emitting efficiency.

[Summary of Embodiments]

As early described, in the organic electroluminescence element in accordance with the present invention, the HOMO and the LUMO of the first host material, the HOMO and the LUMO of the second host material, and the HOMO and the LUMO of the organic light emitting material satisfy the following relational expressions (3) and (4):

$$0.1 \text{ eV} \leq (|\text{HOMO of organic light emitting material}| - |\text{HOMO of first host material}|) \leq 0.3 \text{ eV; and} \quad (3)$$

$$0.1 \text{ eV} \leq (|\text{LUMO of second host material}| - |\text{LUMO of organic light emitting material}|) \leq 0.3 \text{ eV}. \quad (4)$$

Furthermore, in the organic electroluminescence element of the present invention, a light emitting layer includes (i) a first light-emitting layer formed on an anode side and (ii) a second light-emitting layer formed on a cathode side. A host material from which the first light-emitting layer is made has a lowest unoccupied molecular orbital shallower than (i) a lowest unoccupied molecular orbital of a host material from which for forming the second light-emitting layer is made and (ii) a lowest unoccupied molecular orbital of the organic light emitting material, meanwhile, a host material from which the second light-emitting layer is made, has a highest occupied molecular orbital deeper than (i) a highest occupied molecular orbital of the host material from which the first light-emitting layer is made and (ii) a highest occupied molecular orbital of the organic light emitting material.

According to the arrangement, a material, which has a lowest unoccupied molecular orbital shallower than (i) the lowest unoccupied molecular orbital of the organic light emitting material and (ii) the lowest unoccupied molecular orbital of the host material for forming the second light-emitting layer, is employed as the host material from which the first light-emitting layer is made (i.e., the material meets |LUMO (host material for first light-emitting layer)|<|LUMO (host material for second light-emitting layer)| and |LUMO (host material for first light-emitting layer)|<|LUMO (organic light emitting material)|. Meanwhile, a material which has a highest occupied molecular orbital deeper than (i) a highest occupied molecular orbital of the organic light emitting material and (ii) a highest occupied molecular orbital of the host material from which the first light-emitting layer is made is employed as the host material from which the second light-emitting layer is made (i.e., the material meets |HOMO (host material for second light-emitting layer)|>|HOMO (host material for first light-emitting layer)| and |HOMO (host material for second light-emitting layer)|>|HOMO (organic light emitting material)|. Accordingly, the highest occupied molecular orbital of the host material for the second light-emitting layer, is deeper than (i) the highest occupied molecular orbital of the host material, from which the first light-emitting layer is made, and (ii) the highest occupied molecular orbital of the organic light emitting material. This makes it possible to block holes, propagated by first light-emitting layer, from moving toward the second light-emitting layer. Similarly, the lowest occupied molecular orbital of the host material for the first light-emitting layer, is shallower than (i) the lowest occupied molecular orbital of the host material for the second light-emitting layer and (ii) the lowest occupied molecular orbital of the organic light emitting material. This makes it possible to block electrons, propagated to the second light-emitting layer, from moving toward the first light-emitting layer. Accordingly, the holes and the respective electrons, which have been propagated by the organic light emitting material, recombine with each other at an interface between the first light-emitting layer and the second light-emitting layer. The organic EL element thus emits light.

From the above, in the organic EL element of the present invention, it is possible to reduce (i) the number of holes which move toward the second light-emitting layer without recombining with the respective electrons and (ii) the number of electrons which move toward the first light-emitting layer without recombining with the respective holes. As a result, the probability that the holes and the respective electrons recombine with each other can be thus increased, and it is therefore possible to reduce a driving voltage of the organic EL element. Further, the probability that the holes and the respective electrons recombine with each other in a light emitting layer can be thus increased, so that internal quantum yield is improved. This can improve light emitting efficiency.

Further, in the organic electroluminescence element in accordance with the present invention, the HOMO and the LUMO of the first host material, the HOMO and the LUMO of the second host material, and the HOMO and the LUMO of the organic light emitting material satisfy the following relational expressions (5) through (8):

$$|\text{LUMO of first host material}| < |\text{LUMO of second host material}| \quad (5)$$

$$|\text{LUMO of first host material}| < |\text{LUMO of organic light emitting material}| \quad (6)$$

$$|\text{HOMO of second host material}| > |\text{HOMO of first host material}| \quad (7)$$

$$|\text{HOMO of second host material}| > |\text{HOMO of organic light emitting material}|. \quad (8)$$

Furthermore, in the organic electroluminescence element in accordance with the present invention, the HOMO and the LUMO of the first host material, the HOMO and the LUMO of the second host material, and the HOMO and the LUMO of the organic light emitting material satisfy at least one of the following relational expressions (9) and (10):

$$0.5\ \text{eV} < (|\text{LUMO of organic light emitting material}| - |\text{LUMO of first host material}|) \le 0.7\ \text{eV} \quad (9)$$

$$0.5\ \text{eV} < (|\text{HOMO of second host material}| - |\text{HOMO of organic light emitting material}|) \le 0.7\ \text{eV}. \quad (10)$$

According to the arrangement, it is possible to prevent the electrons from moving toward an anode side material (such as a hole transporting material) because the electrons exist in the organic light emitting material for the first light emitting layer. Similarly, it is possible to prevent the holes from moving toward a cathode side material (such as an electron transporting material) because the holes exist in the organic light emitting material for the second light-emitting layer.

Further, in the organic electroluminescence element in accordance with the present invention, the host material for the first light-emitting layer and the host material for the second light-emitting layer have respective excited triplet levels higher than an excited triplet of the organic light emitting material. The arrangement makes it possible to confine an excited energy within the organic light emitting material for the light emitting layer. It is therefore possible to prevent the excited energy from moving from the organic light emitting material.

Further, in the organic electroluminescence element of the present invention, the organic layer includes (A) a hole injection layer to which a first dopant is added to promote injection of holes from the anode to the organic layer and (B) an electron injection layer to which a second dopant is added to promote injection of electrons from the cathode to the organic layer.

According to the arrangement, (i) injection of carriers (which have been injected from the first electrode) into the organic layer and (ii) injection of carriers (which have been injected from the second electrode) into the organic layer are promoted. It is therefore possible to propagate the holes and the electrons enough to the light emitting layer.

Further, the organic electroluminescence element in accordance with the present invention includes a region, between the hole injection layer and the light emitting layer, to which region the first dopant and the organic light emitting material are not added.

Further, the organic electroluminescence element in accordance with the present invention includes a region, between the electron injection layer and the light emitting layer, to which region the second dopant and the organic light emitting material are not added.

According to the arrangement, the region, between the light emitting layer and a hole injection layer, to which the organic light emitting material and the first dopant are not added serves as a blocking layer of carriers. This makes it possible to prevent energy deactivation from occurring, due to exciplex, at an interface between the light emitting layer and the hole injection layer. To put it another way, it is possible to prevent energy loss from the light emitting layer to the hole injection layer. Similarly, providing, between the light emitting layer and a electrode injection layer, the region to which the organic light emitting material and the second dopant are not added, makes it possible to prevent energy loss from the light emitting layer to a electrode injection layer.

Further, in the organic electroluminescence element in accordance with the present invention, the organic light emitting material is a phosphorescent light emitting material.

The arrangement can provide the organic EL element having (i) high light emitting efficiency and (ii) long emission life.

The invention being thus described, it will be obvious that the same way can be varied in many ways. Such variations are not to be regarded as a departure from the spirit and scope of the invention, and all such modifications as would be obvious to one skilled in the art are intended to be included within the scope of the following claims.

EXAMPLES

The present invention will be discussed by Examples below in further detail. Note, however, that the present invention is not limited to Examples, provided that alternatives fall within the subject matter of the present invention.

Example 1

A silicon semiconductor film was formed on a glass substrate by a plasma enhanced chemical deposition (plasma CVD) method, and was subjected to a crystallization process. Then, a polycrystalline semiconductor film was formed on the silicon semiconductor film (polysilicon thin film) which has been subjected to the crystallization process. Then, the polysilicon thin film was subjected to an etching process so that a plurality of island-shaped patterns were formed. Subsequently, silicon nitride (SiN) was formed, as a gate insulating layer, on the islands of the polysilicon thin film. After that, stacked layers of titanium (Ti)-aluminium (Al)-titanium (Ti) were sequentially formed as gate electrodes, and were patterned by the etching process. Source electrodes and drain electrodes were formed on the respective gate electrodes by use of Ti—Al—Ti staked layers. A plurality of thin film transistors were thus formed.

An interlayer insulating film having through holes was formed on the thin film transistors thus formed so as to planarize the thin film transistors. Then, indium tin oxide (ITO) electrodes were formed, as anodes, via the respective through holes. A single layer of a polyimide resin was patterned so as to surround each of the ITO electrodes, and then a substrate on which the ITO electrodes had been formed was subjected to ultrasonic cleaning. After that, the substrate was baked for three hours at 200° C. under a decompressed state.

Next, 4,4'-bis[N-(1-naphthyl)-N-phenyl-amino]biphenyl (α-NPD) was deposited on the anodes at a deposition rate of 1 Å/sec by a vacuum vapor deposition method. A hole injection layer having a film thickness of 45 nm was thus formed on the anodes.

Subsequently, N,N-dicarbazolyl-3,5-benzene (mCP) was deposited on the hole injection layer at a deposition rate of 1

Å/sec by the vacuum vapor deposition method. A hole transport layer having a film thickness of 15 nm was formed on the hole injection layer.

Then, 2,2-bis(4-carbazolylphenyl)-1,1-biphenyl (4CzPBP) and FIr6 were co-deposited on the hole transport layer by the vacuum vapor deposition method. During the co-depositing, FIr6 was added to 4CzPBP so that 4CzPBP contains FIr6 of approximately 7.5%. A first light-emitting layer was thus formed on the hole transport layer so as to have a film thickness of 10 nm.

Subsequently, (tris(2,4,6-trimethyl-3-yl)-3-(pyridine-3-yl)phenyl)borane (3TPYMB) and FIr6 were co-deposited on the first light-emitting layer by the vacuum vapor deposition method. During the co-depositing, FIr6 was added to 3TPYMB so that 3TPYMB contains FIr6 of approximately 7.5%. A second light-emitting layer was formed on the first light-emitting layer so as to have a film thickness of 10 nm.

Then, 1,3,5-tris(N-phenylbenzoimidazole-2-yl)benzene (TPBI) was deposited on the second light-emitting layer by the vacuum vapor deposition method. An electron transport layer was formed on the second light-emitting layer so as to have a film thickness of 30 nm.

Subsequently, a LiF film was formed by depositing LiF on the electron transport layer at a deposition rate of 1 Å/sec by the vacuum vapor deposition method so as to have a film thickness of 0.5 nm. Thereafter, an Al film was formed on the LiF film by use of Al so as to have a film thickness of 100 nm. A stacked layer of the LiF film and the Al film was formed as a cathode. The organic EL element was thus formed.

Current efficiency and an operating life $T_{50}$ of the organic EL element thus obtained were measured under the condition of 1000 cd/m². As a result, the current efficiency was 28 cd/A, and the operating life $T_{50}$ showed 5000 hours, i.e., a favorable value.

Example 2

The step of forming an anode and the steps to be carried out before the step are similar to those in Example 1, and therefore their description is omitted. The following description will discuss (i) a step of forming a hole injection layer on the anode and (ii) steps to be carried out after the step.

In the present example, 4CzPBP and tetrafluorotetracyanoquinodimethan ($TCNQF_4$) were co-deposited at a deposition rate of 1 Å/sec by the vacuum vapor deposition method. During the co-depositing, TCNQF4 was added to 4CzPBP so that 4CzPBP contains TCNQF4 of approximately 10%. A hole injection layer was thus formed on the anode so as to have a film thickness of 50 nm.

Subsequently, 4CzPBP of 10 nm was deposited on the hole injection layer, and then 4CzPBP and FIr6 were co-deposited by the vacuum vapor deposition method. During the co-depositing, FIr6 was added to 4CzPBP so that 4CzPBP contains FIr6 of approximately 7.5%. A first light-emitting layer was thus formed so as to have a film thickness of 10 nm.

Then, 3TPYMB and FIr6 were co-deposited on the first light-emitting layer by the vacuum vapor deposition method. During the co-depositing, FIr6 was added to 3TPYMB so that 3TPYMB contains FIr6 of approximately 7.5%. A second light-emitting layer was thus formed on the first light-emitting layer so as to have a film thickness of 10 nm.

Subsequently, 3TPYMB and cesium carbonate ($Cs_2CO_3$) were co-deposited on the second light-emitting layer by the vacuum vapor deposition method. During the co-depositing, $Cs_2CO_3$ was added to 3TPYMB so that 3TPYMB contains $Cs_2CO_3$ of approximately 50%. An electron injection layer was thus formed on the second light-emitting layer so as to have a film thickness of 30 nm.

Subsequently, a LiF film having a film thickness of 0.5 nm was formed by depositing LiF on the electron injection layer at a deposition rate of 1 Å/sec by the vacuum vapor deposition method. After that, an Al film was formed on the LiF film by use of Al so as to have a film thickness of 100 nm. A stacked layer of the LiF film and the Al film was formed as a cathode. The organic EL element was thus formed.

Current efficiency and an operating life $T_{50}$ of the organic EL element thus obtained were measured under the condition of 1000 cd/m². As a result, the current efficiency was 25 cd/A, and the operating life $T_{50}$ showed 4000 hours, i.e., a favorable value.

In Examples 1 and 2, the light emitting layer has a multilayer structure, and a host material for the light emitting layer is selected by taking into consideration the phosphorescent light emitting material. Specifically, in Example 1, 4CzPBP having LUMO which is shallower than (i) LUMO of FIr6 and (ii) LUMO of the host material (3TPYMB) of the second light-emitting layer was used as the host material for the first light-emitting layer. Further, 3TPYMB having HOMO which is deeper than (i) HOMO of FIr6 and (ii) HOMO of the host material (4CzPBP) of the first light-emitting layer was used as the host material for the second light-emitting layer. Furthermore, 3TPYMB has LUMO deeper than the LUMO of FIr6, and 4CzPBP has the HOMO shallower than the HOMO of FIr6. This makes it possible to prevent (i) the holes injected from the anode from moving toward the second light-emitting layer and (ii) the electrons injected from the cathode from moving toward the first light-emitting layer. Accordingly, it becomes possible to reduce (i) the number of holes which move toward the second light-emitting layer without recombining with the respective electrons, and (ii) the number of electrons which move toward first light-emitting layer without recombining with the respective holes. As a result, a probability that the holes and the respective electrons recombine each other can be thus increased. Therefore, in the organic EL element of Example 1, the current efficiency and the operating life $T_{50}$ each showed a favorable value.

Further, in Example 2, the first light-emitting layer also serves as the hole transport layer, meanwhile, the second light-emitting layer also serves as the electron transport layer, and a dopant is added to each of the hole injection layer and the electron injection layer. This promotes (i) injection of holes into the hole injection layer and (ii) injection of the electrons into electron injection layer. Accordingly, it is possible to propagate the holes and the electrons enough to the light emitting layer. Further, a host material for use in Example 2 is similar to that for use in Example 1. This makes it possible to reduce (i) the number of holes which move to the second light-emitting layer without recombining with the respective electrons and (ii) the number of electrons which move to the first light-emitting layer without recombining with the respective holes. As a result, a probability that the holes and the respective electrons recombine with each other is improved. Therefore, in the organic EL element in accordance with Example 2, each of the current efficiency and the operating life $T_{50}$ showed a favorable value.

Example 3

An organic EL element including a first light-emitting layer was formed similarly to Example 1, except that 4CzCBP was used as the host material for the first light-emitting layer. Specifically, the first light-emitting layer employs (i) adamantane carbazole (Ad-Cz) (HOMO=5.8 eV, LUMO=2.6 eV), instead of the host material 4CzCBP (HOMO=6.0 eV, LUMO=2.5 eV) for the first light-emitting layer in Example 1 and (ii) FIr6 (HOMO=6.1 eV, LUMO=3.1 eV) as a light emitting material like Example 1.

Current efficiency and a driving voltage of the organic EL element thus obtained were measured under the condition of 1000 cd/m². As a result, the current efficiency was 24 cd/A and the driving voltage was approximately 80% of Example 1, which were favorable values. As such, it was experimentally supported that high current efficiency could be expected in a case where a difference between (i) HOMO of the host material for the first light-emitting layer and (ii) HOMO for the phosphorescent light emitting material fells within a range of 0.1 eV to 0.3 eV.

This is based on the fact that the holes and the electrons of the organic EL element are transported by hopping conduction. Mobility of the holes is reduced by exp(−ΔE/RT) (R: gas constant, T: absolute temperature [K]) while the holes and the electrons are transported by the hopping conduction, where "ΔE" indicates a difference between (i) an energy level in which the holes are trapped and (ii) an energy level in which the holes hop. From the above, it is preferable that the HOMO of the host material, from which the first light-emitting layer is made, is shallower than the HOMO of the phosphorescent light emitting material.

If the difference between (i) the HOMO of the host material for the first light-emitting layer and (ii) the HOMO of the phosphorescent light emitting material is larger than 0.5 eV, then a probability that the holes are thermally excited is reduced. Accordingly, it can be said that the difference between (i) the HOMO of the host material for the first light-emitting layer and (ii) the HOMO of the phosphorescent light emitting material is preferably 0.5 eV or less. The following example is a concrete one. An electron (hole) transfer rate can be expressed by a general Arrhenius equation (see Formula (1)). "$k_{ET}$" represents electron (hole) transfer rate constant, and "A" represents frequency factor (which is a constant irrelative to temperature).

$$k_{ET}=A\exp(-\Delta E/RT) \quad (1)$$

As is described in Non-patent Literature 3, "A" is set to $10^{11}M^{-1}s^{-1}$ in a case of an intermolecular reaction. In this case, values of rate constant were calculated for respective numerical values ΔE on the basis of Formula (1). Calculated results are as follows.

In a case of ΔE=0.1 eV, $k_{ET}$=2.0×10⁹ s⁻¹
In a case of ΔE=0.2 eV, $k_{ET}$=4.1×10⁷ s⁻¹
In a case of ΔE=0.3 eV, $k_{ET}$=8.4×10⁵ s⁻¹
In a case of ΔE=0.4 eV, $k_{ET}$=1.7×10⁴ s⁻¹
In a case of ΔE=0.5 eV, $k_{ET}$=3.5×10² s⁻¹
In a case of ΔE=0.6 eV, $k_{ET}$=7.1 s⁻¹

The calculated results demonstrate that (i) when ΔE is 0.5 eV or less, the electrons move, between molecules, toward the phosphorescent light emitting material from the host material for the first light-emitting layer within sub milli-second (29 ms when ΔE=0.5 eV) and (ii) when ΔE exceeds 0.6 eV, the electrons only move in seconds. This means that, when ΔE is 0.5 eV or less, the electrons can move even if the energy difference is like an uphill energy difference in which electrons move to the host material for the first light-emitting layer from the phosphorescent light emitting material.

Energy [f(x)] stabilized by an electric field can be expressed as the following Formula (2). Specifically, the energy [f(x)] is energy which causes an electron to be stabilized after the electron is moved by a distance "x" when an electric field "V" is applied across the electron. Note that "q" is an elementary charge (absolute value of electric charge of electron).

$$f(x)=-qVx \quad (2)$$

It is construable from Formula (2) that application of an electric field causes (i) an electron (a hole) to be less likely to move in a direction opposite to a direction of the electric field and (ii) the electron (hole) to be more likely to move along a gradient of the electric field. That is, when the holes are once moved by influence of the electric field, the holes (i) are less likely to move back from the first light-emitting layer toward the anode side material (such as a hole transporting material) and (ii) predominantly move from the host material for the first light-emitting layer toward the phosphorescent light emitting material.

Accordingly, in a case where the difference between (i) the HOMO of the host material, from which for the first light-emitting layer is made, and (ii) the HOMO of the phosphorescent light emitting material is 0.5 eV or less, the probability that the holes are thermally excited is increased. This makes it possible to improve the probability that the holes and the respective electrons recombine with each other. In a case where the difference between (i) the HOMO of the host material for the first light-emitting layer and (ii) the HOMO of the phosphorescent light emitting material is more than 0 eV, it is possible to reduce an energy gap between the HOMO and the LUMO of the host material. This ultimately gives rise to a low driving voltage of a device which includes the organic EL element.

Similarly to this reason, it is preferable that (I) the LUMO of the host material for the second light-emitting layer is shallower than the LUMO of the phosphorescent light emitting material and (II) a difference between (i) the LUMO of the host material for the second light-emitting layer and (ii) the LUMO of the phosphorescent light emitting material is more than 0 eV but 0.5 eV or less.

Furthermore, it was experimentally confirmed that the LUMO of the host material for the first light-emitting layer can be driven with a low voltage, in a case where (i) the LUMO of the host material is deeper than the LUMO of the phosphorescent light emitting material and (ii) the difference between the LUMO of the host material and the LUMO of the phosphorescent light emitting material is more than 0.5 eV but 0.7 eV or less. That is, it is preferable that 0.5 eV< (|LUMO (phosphorescent light emitting material)|−|LUMO (host material for first light-emitting layer)|)≤0.7 eV is preferable. This causes the electrons to move toward the anode side material from the host material for the first light-emitting layer. It is therefore possible to prevent the organic EL element from having a low emitting efficiency.

Similarly, it was experimentally confirmed that the organic EL element can be driven at a low voltage in a case where (I) the HOMO of the host material for the second light-emitting layer, is deeper than the HOMO of the phosphorescent light emitting material and (II) the difference between (i) the HOMO of the host material for the second light-emitting layer and (ii) the HOMO of the phosphorescent light emitting material is larger than 0.5 eV but 0.7 eV or less. That is, 0.5 eV<(|HOMO (host material for second light-emitting layer)|−|HOMO (phosphorescent light emitting material)|)≤0.7 eV is preferable. This makes it possible to prevent the holes from moving toward the cathode side material from the host material for the second light-emitting layer and therefore to prevent the organic EL element from having a low emitting efficiency.

INDUSTRIAL APPLICABILITY

The present invention is applicable to various kinds of device, employing an organic EL element, such as a display device of a television set.

REFERENCE SIGNS LIST 11, 21, 31 organic EL element
12, 22, 32 anode
13, 23, 33 hole injection layer
14, 34 hole transport layer
15, 25, 35 light emitting layer
15a, 25a first light-emitting layer
15b, 25b second light-emitting layer
16, 36 electron transport layer
17, 27, 37 electron injection layer
18, 28, 38 highest occupied molecular orbital of phosphorescent light emitting material
19, 29, 39 lowest occupied molecular orbital of phosphorescent light emitting material
30 cathode

The invention claimed is:

1. An organic electroluminescence element, comprising:
an anode;
a cathode; and
an organic layer provided, on a substrate, between the anode and the cathode, the organic layer including at least a light emitting layer,
the light emitting layer including (i) a first light-emitting layer, provided on an anode side, that is made from a first host material which is a hole transportability host and (ii) a second light-emitting layer, provided on a cathode side, which is made from a second host material serving as an electron transportability host,
an organic light emitting material is added to each of the first host material and the second host material,
a highest occupied molecular orbital (HOMO) and a lowest occupied molecular orbital (LUMO) of the first host material, HOMO and LUMO of the second host material, and HOMO and LUMO of the organic light emitting material satisfying the following relational expressions (1) and (2):

$$0\ eV<(|HOMO\ of\ organic\ light\ emitting\ material|-|HOMO\ of\ first\ host\ material|) \le 0.5\ eV; \quad (1) \text{ and}$$

$$0\ eV<(|LUMO\ of\ second\ host\ material|-|LUMO\ of\ organic\ light\ emitting\ material|) \le 0.5\ eV. \quad (2).$$

2. The organic electroluminescenee element as set forth in claim 1,
wherein the HOMO and the LUMO of the first host material, the HOMO and the LUMO of the second host material, and the HOMO and the LUMO of the organic light emitting material satisfy the following relational expressions (3) and (4):

$$0.1\ eV \le (|HOMO\ of\ organic\ light\ emitting\ material|-|HOMO\ of\ first\ host\ material|) \le 0.3\ eV; \quad (3)$$

and $$0.1\ eV \le (|LUMO\ of\ second\ host\ material|-|LUMO\ of\ organic\ light\ emitting\ material|) \le 0.3\ eV. \quad (4).$$

3. The organic electroluminescence element as set forth in claim 1,
wherein the HOMO and the LUMO of the first host material, the HOMO and the LUMO of the second host material, and the HOMO and the LUMO of the organic light emitting material satisfy the following relational expressions (5) through (8):

$$|LUMO\ of\ first\ host\ material|<|LUMO\ of\ second\ host\ material| \quad (5)$$

$$|LUMO\ of\ first\ host\ material|<|LUMO\ of\ organic\ light\ emitting\ material| \quad (6)$$

$$|HOMO\ of\ second\ host\ material|>|HOMO\ of\ first\ host\ material| \quad (7)$$

$$|HOMO\ of\ second\ host\ material|>|HOMO\ of\ organic\ light\ emitting\ material| \quad (8).$$

4. The organic electroluminescence element as set forth in claim 1,
wherein the HOMO and the LITMO of the first host material, the HOMO and the LUMO of the second host material, and the HOMO and the LUMO of the organic light emitting material satisfy at least one of the following relational expressions (9) and (10):

$$0.5\ eV<(|LUMO\ of\ organic\ light\ emitting\ material|-|LUMO\ of\ first\ host\ material|) \le 0.7\ eV \quad (9)$$

$$0.5\ eV<(|HOMO\ of\ second\ host\ material|-|of\ organic\ light\ emitting\ material|) \le 0.7\ eV \quad (10).$$

5. The organic electroluminescence element as set forth in claim 1,
wherein the host material, from which the first light-emitting layer is made, and the host material, from which the second light-emitting layer is made, have respective excited triplet levels higher than an excited triplet of the organic light emitting material.

6. The organic electroluminescence element as set forth in claim 1,
wherein the organic layer includes (i) a hole injection layer to which a first dopant is added to promote injection of holes from the anode to the organic layer and (ii) an electron injection layer to which a second dopant is added to promote injection of electrons from the cathode to the organic layer.

7. The organic electroluminescence element as set forth in claim 6,
wherein there is a region, between the hole injection layer and the light emitting layer, to which region the first dopant and the organic light emitting material are not added.

8. The organic electroluminescence element as set forth in claim 7,
wherein there is a region, between the electron injection layer and the light emitting layer, to which region the second dopant and the organic light emitting material are not added.

9. The organic electroluminescence element as set forth in claim 1,
wherein the organic light emitting material is a phosphorescent light emitting material.

10. An organic electroluminescence display device, comprising:
a display unit in which an organic electroluminescence element recited in claim 1 is formed on a thin film transistor substrate.

11. A method for manufacturing an organic electroluminescence element,
the organic electroluminescence element including an anode, a cathode, and an organic layer, provided on a substrate, between the anode and the cathode, the organic layer including at least a light emitting layer, said method comprising the steps of:

(i) forming the anode on the substrate, (ii) forming, on the anode, a hole injection, layer to which holes are injected from the anode, (iii) forming, on the hole injection layer, a hole transport layer for transporting the holes, the holes having been injected from the anode into the organic layer, (iv) forming, on the hole transport layer, a first light-emitting layer serving as the light emitting layer, the first light-emitting layer being made from a first host material serving as a hole transportability host, (v) forming, on the first light-emitting layer, a second light-emitting layer serving as the light emitting layer, the second light-emitting layer being made from a second host material serving as an electron transportability host, (vi) forming, on the second light-emitting layer, an electron transport layer for transporting electrons, the electrons having been injected from the cathode into the organic layer, (vii) forming, on the electron transport layer, an electron injection layer to which the electrons are injected from the cathode, (viii) forming the cathode on the electron injection layer, in the steps (iv) and (v), an identical organic light emitting material being added to each of the first host material and the second host material, and the first light-emitting layer and the second light-emitting layer being formed by use of (I) the first host material, (II) the second host material, and (III) the organic light emitting material, the first host material, the second host material, and the organic light emitting material each having HOMO and LUMO which satisfy the following relational expressions (11) through (16):

$$0\ eV < (|HOMO\ of\ organic\ light\ emitting\ material| - |HOMO\ of\ first\ host\ material|) \leq 0.5\ eV; \quad (11)$$

$$0\ eV < (|LUMO\ of\ second\ host\ material| - |LUMO\ of\ organic\ light\ emitting\ material|) \leq 0.5\ eV; \quad (12)$$

$$|LUMO\ of\ first\ host\ material| < |LUMO\ of\ second\ host\ material|; \quad (13)$$

$$|LUMO\ of\ first\ host\ material| < |LUMO\ of\ organic\ light\ emitting\ material|; \quad (14)$$

$$|HOMO\ of\ second\ host\ material| > |HOMO\ of\ first\ host\ material|; \quad (15)\ and$$

$$|HOMO\ of\ second\ host\ material| > |HOMO\ of\ organic\ light\ emitting\ material| \quad (16).$$

* * * * *